(12) United States Patent
Belyansky et al.

(10) Patent No.: US 7,202,516 B2
(45) Date of Patent: Apr. 10, 2007

(54) CMOS TRANSISTOR STRUCTURE INCLUDING FILM HAVING REDUCED STRESS BY EXPOSURE TO ATOMIC OXYGEN

(75) Inventors: Michael P. Belyansky, Bethel, CT (US); Diane C. Boyd, LaGrangeville, NY (US); Bruce B. Doris, Brewster, NY (US); Oleg Gluschenkov, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/318,844

(22) Filed: Dec. 27, 2005

(65) Prior Publication Data

US 2006/0131659 A1 Jun. 22, 2006

Related U.S. Application Data

(62) Division of application No. 10/605,889, filed on Nov. 4, 2003, now Pat. No. 6,982,196.

(51) Int. Cl.
*H01L 29/80* (2006.01)
(52) U.S. Cl. .................... 257/274; 257/204
(58) Field of Classification Search ............ 257/204, 257/274
See application file for complete search history.

(56) References Cited

U.S. PATENT DOCUMENTS

| 4,994,141 | A | 2/1991 | Harms et al. |
|---|---|---|---|
| 5,716,480 | A | 2/1998 | Matsuyama et al. |
| 5,847,419 | A | 12/1998 | Imai et al. |
| 6,316,820 | B1 | 11/2001 | Schmitz et al. |
| 6,504,235 | B2 | 1/2003 | Schmitz et al. |
| 6,538,278 | B1 | 3/2003 | Chau |
| 6,566,210 | B2 | 5/2003 | Ajmera et al. |
| 6,887,798 | B2 | 5/2005 | Deshpande et al. |
| 2002/0197803 | A1 | 12/2002 | Leitz et al. |
| 2003/0010972 | A1 | 1/2003 | Ajmera et al. |
| 2004/0129673 | A1 | 7/2004 | Belyansky et al. |
| 2005/0093078 | A1* | 5/2005 | Chan et al. .................. 257/374 |

FOREIGN PATENT DOCUMENTS

JP     2002-305205     10/2002

* cited by examiner

*Primary Examiner*—Long Pham
(74) *Attorney, Agent, or Firm*—Yuanmin Cai

(57) ABSTRACT

A structure and method are provided in which a stress present in a film is reduced in magnitude by oxidizing the film through atomic oxygen supplied to a surface of the film. In an embodiment, a mask is used to selectively block portions of the film so that the stress is relaxed only in areas exposed to the oxidation process. A structure and method are further provided in which a film having a stress is formed over source and drain regions of an NFET and a PFET. The stress present in the film over the source and drain regions of either the NFET or the PFET is then relaxed by oxidizing the film through exposure to atomic oxygen to provide enhanced mobility in at least one of the NFET or the PFET while maintaining desirable mobility in the other of the NFET and PFET.

9 Claims, 9 Drawing Sheets

CMOS TRANSISTOR STRUCTURE INCLUDING FILM HAVING REDUCED STRESS BY EXPOSURE TO ATOMIC OXYGEN

CROSS-REFERENCE TO RELATED APPLICATIONS

This application is a divisional of U.S. patent application Ser. No. 10/605,889 filed Nov. 4, 2003, now U.S. Pat. No. 6,982,196, hereby incorporated herein by reference.

BACKGROUND OF THE INVENTION

The present invention relates to the fabrication of semiconductor integrated circuits, and more specifically to a method of altering the stress of a thin film and complementary metal oxide semiconductor (CMOS) transistor structures which are formed with such stress altered film.

Thin layers of film are used in the semiconductor industry to alter or enhance the characteristics of adjacent and underlying or base layers. The film may be comprised of a variety of materials chosen selectively to provide certain advantages. Among of the advantages provided by a particular film are a desirable thickness, longevity and dielectric strength, as well as the ability to withstand temperatures. A layer of film can also enhance conformity of deposition of other layers, or provide gap filling characteristics or enhance planarity. Some such films, although desirable in some respects, have an undesirable stress present in them.

However, in certain circumstances, stress may be desirable in the film if applied selectively. Such is the case in complementary metal oxide semiconductor (CMOS) technology. CMOS transistors, for example, are used in some types of static random access memory (SRAM) and in logic circuitry. The term "CMOS transistors" is understood to include the two complementary types of field effect transistors (FET) known as n-type and p-type FETs. To create the two complementary FETs, the conductivity of the semiconductor material is altered and controlled by application of electrical field. CMOS circuitry, utilizes both n-type FETs and p-type FETs devices with different types of carriers.

Traditionally, performance gains for CMOS circuits have been produced by shrinking the gate dimension and thinning the gate oxide. However, with the advent of new technology this approach is becoming less desirable due to its physical limitations. An alternative approach is to introduce structures that enhance electron mobility in n-type transistors and enhance hole mobility in p-type transistors.

Both theoretical and empirical studies have demonstrated that charge carrier mobility in a transistor can be greatly increased when a stress of sufficient magnitude is applied to the conduction channel of a transistor to create a strain therein.

Strain can be either tensile or compressive. In p-type field effect transistors, the application of a compressive longitudinal stress, i.e. in the direction of the current flow in the conduction channel, creates a strain in the conduction channel which is known to increase the drive current of a PFET. However, if that same stress is applied to the conduction channel of an NFET, its drive current decreases.

Performance of an NFET and a PFET can be greatly improved by applying a tensile longitudinal stress to the conduction channel of an NFET and applying a compressive longitudinal stress to the conduction channel of a PFET. Prior art methods have been unsuccessful in providing an effective process to modify stress in compressive and tensile channel regions at the same time. Accordingly, it would be desirable to provide a single process for creating a desired compressive strain in the channel region of a PFET without creating the same strain in the channel region of the NFET, and to create a desired tensile stress in the channel region of an NFET without creating the same strain in the channel region of a PFET.

Other than its application to CMOS or even the semiconductor industry, the development of a process that can selectively relax a film by reducing the stress present in certain areas of a film can have widespread benefits. The performance of microstructures and nanostructures such as microelectronics components and micro-electromechanical machines can be greatly enhanced by the application of such a process to a stressed film. Therefore, it is desirable to develop a process to relax the stress present in a film in selected areas.

SUMMARY OF THE INVENTION

According to an aspect of the invention, a method is provided for relaxing a stress present in a film contacting a base layer. The method includes oxidizing the film to reduce a magnitude of the stress by supplying atomic oxygen to a surface of the film.

According to another aspect of the invention, a method of fabricating an integrated circuit including a p-type field effect transistor (PFET) and an n-type field effect transistor (NFET) is provided in which the NFET and the PFET each have a channel region and a source and drain region. The method includes forming a PFET gate stack and an NFET gate stack over a single-crystal region of a semiconductor, the PFET gate stack and the NFET gate stack each having a gate conductor overlying a gate dielectric formed on a main surface of the single-crystal region and spacers including a first material formed on sidewalls of the gate conductor. A film having a stress is formed over the source and drain regions of the NFET and the PFET. The source and drain regions of either the NFET or the PFET are then blocked with a mask. Portions of the film not blocked by the mask are then oxidized by supplying atomic oxygen to a surface of the film to reduce a magnitude of the stress in the film over the source and drain regions of the PFET or the NFET, respectively.

According to another aspect of the invention, an integrated circuit including a p-type field effect transistor (PFET) and an n-type field effect transistor (NFET) is provided, the NFET and the PFET each having a channel region and a source and drain region. The integrated circuit includes a PFET gate stack and an NFET gate stack formed over a substrate including a single-crystal semiconductor region, the PFET gate stack and the NFET gate stack each having a gate conductor overlying a gate dielectric formed on a main surface of the single-crystal region and spacers including a first material formed on sidewalls of the gate conductor. A film having a stress is formed over the source and drain regions of the NFET and the PFET. The stress has a reduced magnitude over the source and drain regions of either the NFET or the PFET as a result of oxidizing portions of the film over the source and drain regions of the NFET or the PFET, respectively, by exposure to atomic oxygen.

According to yet another aspect of the invention, a structure is provided including a base layer and an oxidized film contacting the base layer, the film having a stress and being oxidized to relax the stress through exposure to atomic oxygen at a surface of the film.

DETAILED DESCRIPTION

FIGS. 1 through 14 illustrate stages of a fabrication process according to different embodiments of the present invention. These embodiments as provided in FIGS. 1 and 2; and 3 through 6 provide for the processing and formation of a stressed film that is selectively relaxed in certain areas. FIGS. 7 through 14 focus on the application of the present invention to a CMOS fabrication process having a p-type field effect transistor (PFET) and an n-type field effect transistor (NFET) on a semiconductor substrate or wafer. In the PFET, a stress is applied to the channel region in a first magnitude by a layer of stressed film formed over the source and drain regions. On the other hand, the stress applied to the channel region of the NFET by the film formed over the source/drain regions of the NFET is relaxed. In such manner, an increase in carrier mobility of the PFET is achieved while still maintaining desirable performance in the NFET. Alternatively, the stress applied to the channel region of the PFET by the film formed over the source/drain region regions of the PFET is relaxed. In such manner, an increase in electron mobility of the NFET is achieved while still maintaining desirable performance in the PFET.

Figure 1:
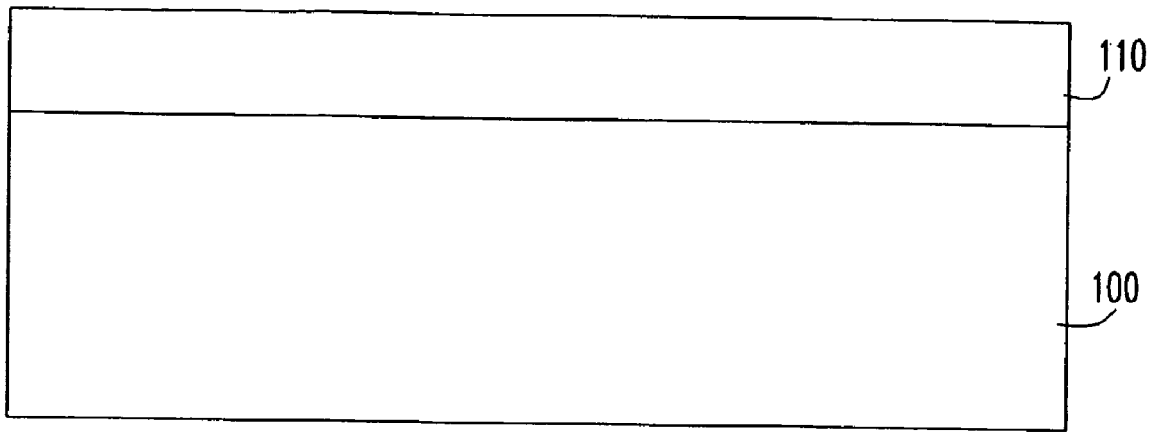
FIGS. 1 and 2 illustrate stages in processing according to an aspect of the present invention.

FIG. 1 illustrates a first stage in processing according to an aspect of the invention. In FIG. 1, film 110, having a tensile stress or, alternatively a compressive stress is provided over a base layer. The base layer can be any suitable surface on which film 110 is provided. Desirably, the film 110 includes a substrate of silicon or a silicon compound such as silicon nitride, silicon carbide, silicon dioxide, silicon germanium and the like or a variety of silicide layers or other such materials.

In the embodiment illustrated in FIG. 1, the base layer is a substrate 100 such as a semiconductor substrate, but other base layers as mentioned are possible. The film layer is deposited over the base layer of the substrate 100, as shown at 110. It should also be noted that the term "substrate" is used herein for ease of reference as well and can include a variety of types of substrates. Preferably, the surface of such substrate includes a single crystal semiconductor. Some examples of such substrates are bulk semiconductor substrates, semiconductor-on-insulator substrates such as a "silicon-on-insulator" (SOI) substrates, silicon germanium (SiGe) substrates or other such similar substrates including substrates composed of III-V compounds. Typically, the substrate includes a region of a single-crystal semiconductor at a main surface thereof. The term substrate may also be applied to a substrate having a thin deposited semiconductor layer when the process described herein is used to form a thin film transistor (TFT).

Figure 2:
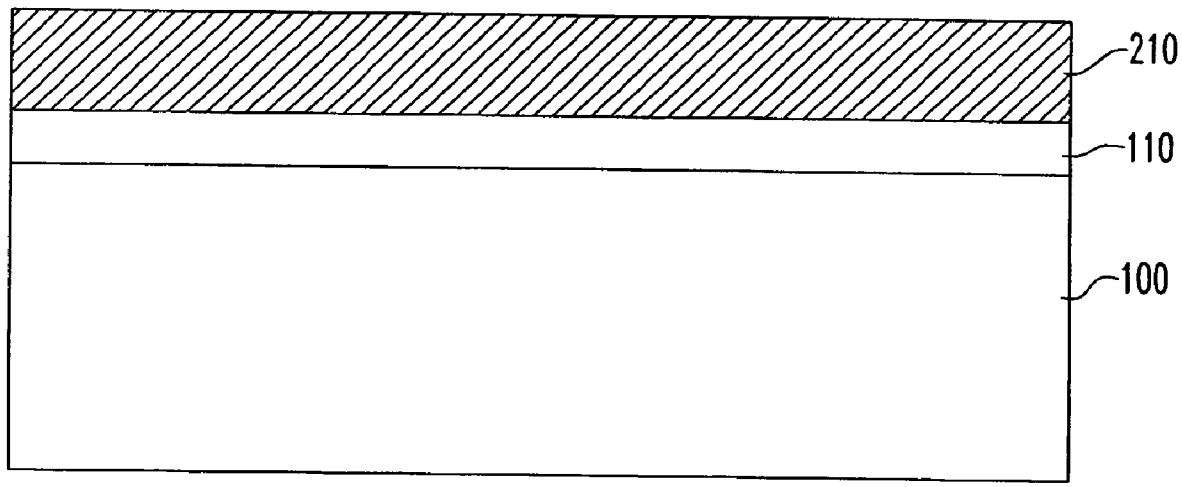

As illustrated in FIG. 2, the stressed film 110 is relaxed as shown at 210 using an oxidation process such as a high density plasma oxidation process in a chamber. Typically, a high density plasma oxidation process is performed by ionizing an ambient of an oxygen bearing gas, such as molecular oxygen ($O_2$), water vapor ($H_2O$), nitrous oxide ($N_2O$), nitric oxide (NO), ozone ($O_3$) or other similar gases through use of an electric field. Such plasma is typically created by an electric field which alternates at radio frequency, although lower frequencies and even direct current (DC) are capable of creating a plasma.

An improved oxidation process is described in commonly assigned U.S. patent application Ser. No. 10/338,254 filed Jan. 7, 2003 which is hereby incorporated herein by reference. In that application, a preferred method of oxidation is provided, referenced as a high density plasma oxidation (HDPO) process.

As described in that application, the HDPO process performs oxidation on a semiconductor substrate using a plasma having a mixture of oxygen-bearing gas and diluent gas that is normally non-reactive to oxygen. Such HDPO process can relax a stressed film of silicon nitride, oxide or polysilicon deposited on such substrate. During the HDPO process, the oxygen and diluent gas mixture are ionized to create a plasma having an electron density of at least about $1.0 \times 10^{12}$ $cm^{-3}$. The substrate surface is then oxidized with energetic particles created in the plasma to form an oxide film of substantially uniform thickness. The oxygen gas may comprise between 10 and 95 percent of the mixture by mole fraction and the diluent gas may comprise between 5 and 90 percent of the mixture by mole fraction. The diluent gas can comprise a variety of gas or gas combinations with some examples being Ne, Ar, Kr, Xe and Rn. The energetic particles comprise primarily atomic oxygen and the plasma contains ambient electrons having an average temperature greater than about 1 eV. The oxidation of the substrate usually takes place below 700 degrees Celsius, and preferably at a temperature ranging between room temperature (around 20 degrees Celsius) to about 500 degrees Celsius.

A high density plasma reactor can alternatively be used with the process. In such a case the substrate, preferably having an area of 30,000 $mm^2$ or larger and having a surface capable of being converted to an oxide in a reactor, is introduced in a reactor to a mixture of oxygen gas and a diluent gas normally non-reactive to the oxygen such as Ne, Ar, Kr, Xe and Rn among others. The oxygen and diluent gas mixture is then ionized to create a plasma having an electron density of at least about $1.0 \times 10^{12}$ $cm^{-3}$ and the surface of the substrate is oxidized with energetic particles created in the plasma to form an oxide film. The reactor may alternatively comprise a containment structure for containment of substrate and creation and maintaining the plasma until the oxidation film is formed.

The HDPO process is a preferred process for the embodiments of the present invention for relaxing the layer of stressed film, although other process can be equally applied. One reason that makes HDPO a preferred process can be illustrated by referring to FIG. 2. In this instance the process allows the relaxing of the stressed film 110 through the conformal growth of an oxide layer 200 with good uniformity, preferably having less than 2% standard deviation in thickness. The HDPO process relaxes a stressed film which can be one of a variety of materials such as silicon, polysilicon, silicon nitride or surfaces of other similar materials. The HDPO process also has the unique ability to be independent of the nature of the underlying surface or its crystallographic orientation. In addition, HDPO is a low temperature process, with processing temperatures ranging most often between 200 and 450 degrees Celsius. This low temperature characteristic makes HDPO compatible with most middle-of-line (MOL) or back-end-of-line (BEOL) applications. The change in the total film stack and composition caused by HDPO leads to change in the overall stress applied to a region of a substrate in proximity to the film stack.

Plasma processes, such as the preferred HDPO process, can relax both tensile and compressive stressed films. HDPO can introduce compression when applied to tensile film. It can introduce tension when applied to a compressive film. This trend is applicable on a range of blanket deposited tensile and compressive films of a variety of materials such as SiN and polysilicon. Other plasma oxidation techniques could also be used to alter stress in thin films: for example, any remote plasma reactor, where ions do not directly bombard the wafer surface.

Without intending to be limited by any theory of operation, applicants note that the main oxidizing agent in the aforementioned high-density plasma oxidation processes is atomic oxygen or oxygen radical. Oxygen radicals are highly active chemical species which can support oxidizing reactions well below a temperature of 550 degrees C., while being relatively stable with respect to many surfaces of many common dielectrics, despite mutual collisions in the gas phase. For instance, a probability of oxygen atom to recombine upon a collision with common dielectric materials (e.g. quartz, boron nitride) is less than 0.01 and, typically, about 0.001. To state it another way, an atomic oxygen particle (O) can undergo hundreds or thousands of collisions with inert surfaces prior to a recombination event. This is contrary to charge particles (e.g. ions, electrons) which recombine in nearly every collision with virtually any surface. Further, when two oxygen atoms (O, O) collide in a gas phase they cannot form an oxygen molecule ($O_2$) due to the violation of energy and momentum conservation. The volume recombination of atomic oxygen proceeds through so-called triple (or higher order) collisions when a third particle (e.g. oxygen molecule or neutral gas molecule) participates in the collision. The probability of a triple collision process decreases quickly with gas pressure and becomes comparable to the surface recombination processes at below 100 Torr. Accordingly, atomic oxygen radicals can be in a relative abundance at a reduced gas pressure of below 100 Torr and, preferably below 30 Torr provided that there is a mechanism for producing such atomic species. Typically, the radicals are produced with some form of excitation. The aforementioned high-electron-density plasmas is one example of such excitation. Other methods of excitation may include remote electrical discharges, intense electromagnetic radiation including infrared, visible, ultraviolet, and X-ray portions of spectrum, intense remote heat, electron or ion beams, and chemical processes including decomposition of unstable molecules (e.g. ozone $O_3$) and multi-step reactions (e.g. between molecular hydrogen $H_2$ and oxygen $O_2$). Due to the relative stability of the radicals, they can be transported from the excitation zone to the process zone with minimal losses. Accordingly, there are many variation of the oxidation design. For the purpose of this invention, any atomic oxygen generating reactor capable of providing either a partial pressure of atomic oxygen from about 0.03 mTorr to about 30 Torr in the vicinity of the wafer surface, or a number density of oxygen atoms from about $1 \times 12$ $cm^{-3}$ to about $3 \times 10^{17}$ $cm^{-3}$ Torr in the vicinity of the wafer surface, or oxygen atom flux striking wafer surface of from about $1 \times 10^{16}$ $s^{-1}$ $cm^{-2}$ to about $3 \times 10^{21}$ $s^{-1}$ $cm^{-2}$ is suitable for altering stress of silicon nit and other oxidation-resistant films.

In the embodiment illustrated in FIG. 2, an HDPO process oxidizes the top part of the film 110 so that a layer of conformal oxide 210 grows on the film surface. However, it is possible to completely oxidize thin films (such as by the HDPO process) depending on the desired reduction in stress and integration into other processes. Once the oxide layer 210 is provided and the film stress is relaxed, future processes such as further annealing are shown to have little effects on the altered stress characteristics of the film stack. The resulting film stack (original film 110 and the oxidized layer 210) is found to have lesser stress than the original film.

Figure 15:
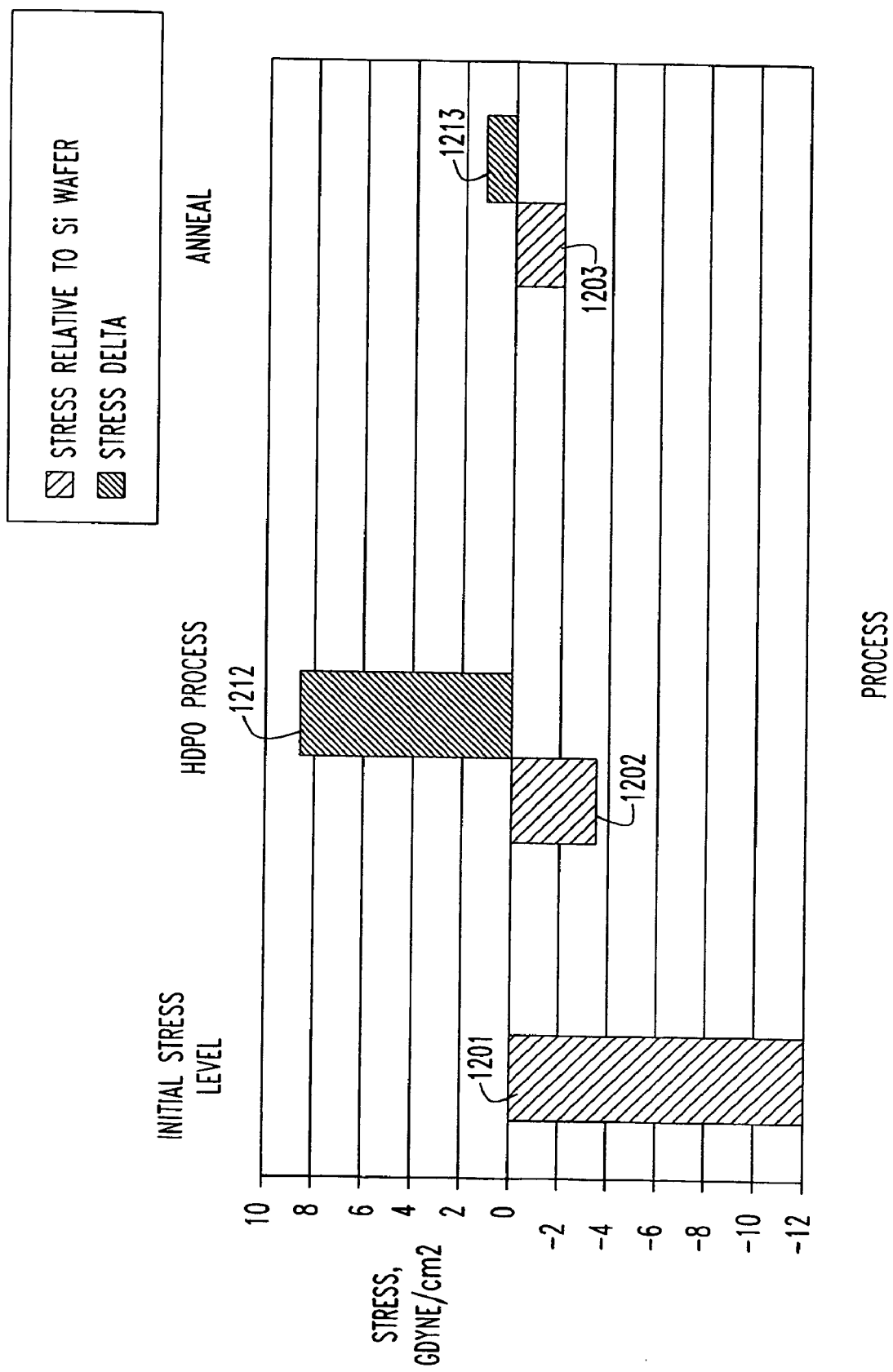
FIG. 15 is graph illustration of experimental data obtained for compressive stress present in a silicon nitride film under various conditions.
Figure 16:
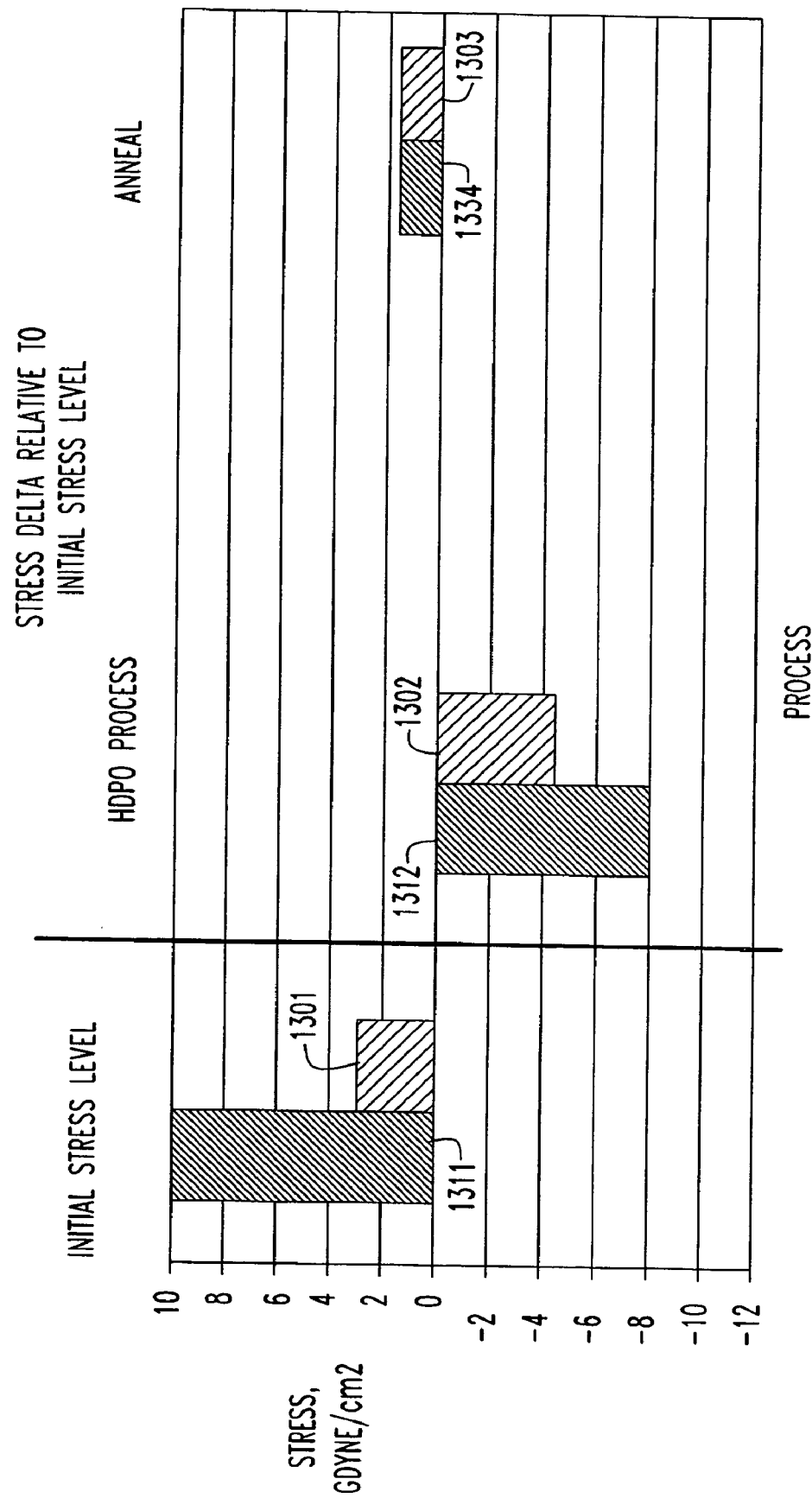
FIG. 16 is a graph illustration of experimental data obtained for tensile stress values in a silicon nitride and in a polysilicon under various conditions.

FIGS. 15 and 16 are aids to understanding principles on which the structure and method of the present embodiments of the invention are founded. Similar results are obtained with silicon nitride and polysilicon films. FIGS. 15 and 16 provide actual experimental data illustrating the reduction of stress due to the HDPO process. FIG. 15 graphically illustrates magnitudes of compressive stress extant in a silicon nitride film deposited on a substrate. The film thickness used in this example is about 100 Å thick. In FIG. 15, the bars. 1201, 1202 and 1203 indicate the magnitude of the stress relative to the silicon wafer (absolute compressive stress values with respect to Si wafer). The bars 1212 and 1234 indicate compressive stress delta values (the change in stress for each step). Bar 1201 illustrates the initial stress value of −12 Gdyne/$cm^2$ obtained for a stressed silicon nitride (SiN) film formed on a bare silicon wafer. Bar 1202 indicates that the SiN film is relaxed to a compressive stress value of about −3 Gdyne/$cm^2$ when the HDPO process is performed to fully oxidize the SiN film. Bar 1212 indicates that the compressive stress has been relaxed in the process by a net change of 9 Gdyne/$cm^2$.

Bar 1203 further indicates the stress value after an annealing process. For this example, the annealing process is conducted at a temperature range of around 600 degrees Celsius for thirty minutes in a nitrogen ambient environment. As indicated by bar 1203 in FIG. 15, the annealing process has little effect on the stress level and only shifts the compressive stress level to a value of around −2 Gdyne/$cm^2$. Bar 1213 indicates that the net change in the stress is 1 Gdyne/$cm^2$.

FIG. 16 is a graph illustrating a similar graphical summarization but as applied to a tensile stress film as opposed to a compressive stress film. FIG. 16 (similar to FIG. 15), graphically illustrates magnitudes of tensile stress extant in silicon nitride and polysilicon films. The thickness of the films used in this example is about 100 Å. In FIG. 16, the bar 1311 represents the initial tensile stress of a silicon nitride film having a value of 10 Gdyne/$cm^2$ relative to a semiconductor wafer on which the silicon nitride film is disposed. The bar 1301 represents the initial tensile stress of a polysilicon film having a value of 3 Gdyne/$cm^2$ relative to a semiconductor wafer on which the polysilicon film is disposed. The net change in the stress level of the silicon nitride tensile film is shown by the bars 1312 and 1334. Bar 1312 indicates the reduction of the tensile stress in the silicon nitride film by 8 Gdyne/$cm^2$ after HDPO oxidation process. After the HDPO oxidation, an anneal may be performed, at a temperature of 550 degrees C., for example, on the fully oxidized film. Bar 1334 indicates that the tensile stress in the silicon nitride film increases by 1.5 Gdyne/cm as a result of annealing the fully oxidized SIN film.

The net change in the stress level of the polysilicon film after HDPO oxidation is shown by the bar 1302. Bar 1302 indicates that there is a net reduction in the tensile stress of the polysilicon film by about −4 Gdyne/cm$^2$ when HDPO is used to fully oxidize the polysilicon film. After the HDPO oxidation, an anneal may be performed, at a temperature of 550 degrees C., for example, on the fully oxidized film. Bar 1303 indicates that the tensile stress in the polysilicon film increases by only 1.5 Gdyne/cm$^2$ from the anneal compared to the stress level 1302 reached in the fully oxidized film.

An advantage of the HDPO process is that annealing after HDPO does not significantly affect the final film stress value. Typically, when HDPO is not first performed, films show a very significant change in stress value when annealed at temperatures above 500 degrees C. However, as indicated in FIGS. 15 and 16, films subjected to an HDPO process exhibit only relatively small changes in stress, generally being between about one and two Gdyne/cm$^2$ in the tensile direction.

An embodiment of the invention is illustrated in FIGS. 3 through 6. In this embodiment, a stressed film is formed over a base layer as in the previous aspect, and then a block mask is then used to mask regions of the film so as to retain the original stress level during the plasma or the HDPO process that relaxes the film. In this manner, only selected areas of the film are relaxed.

Figure 3:
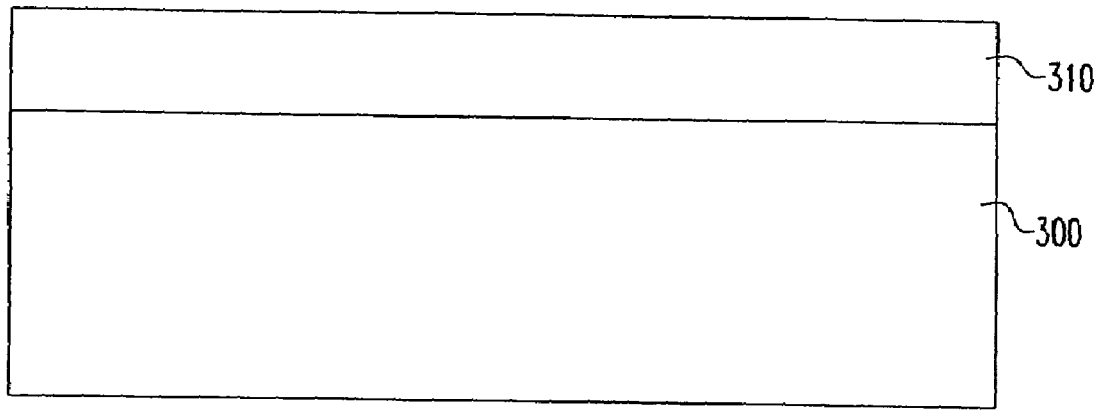
FIGS. 3 through 6 illustrate stages in processing according to a second aspect of the present invention.
Figure 4:
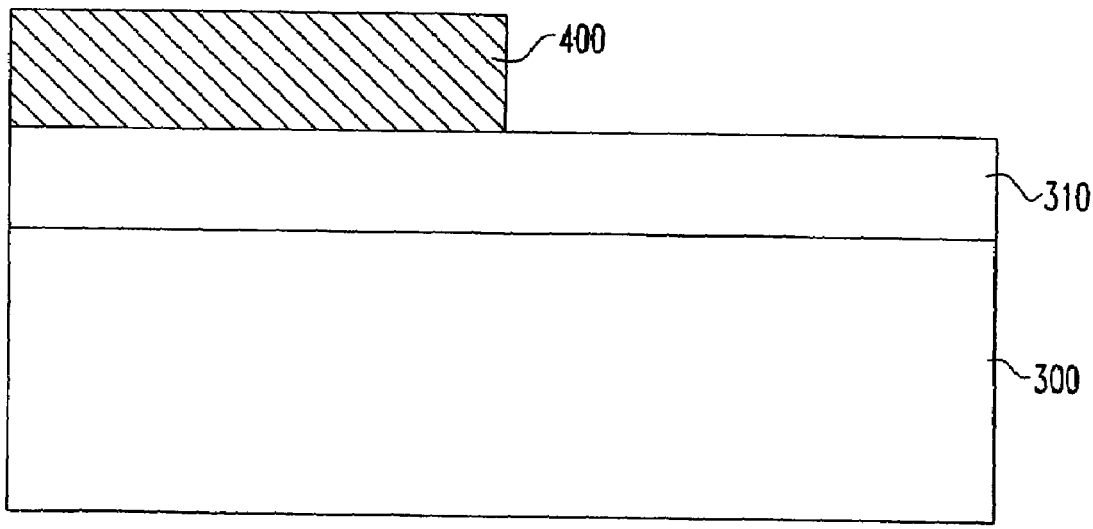
Figure 5:
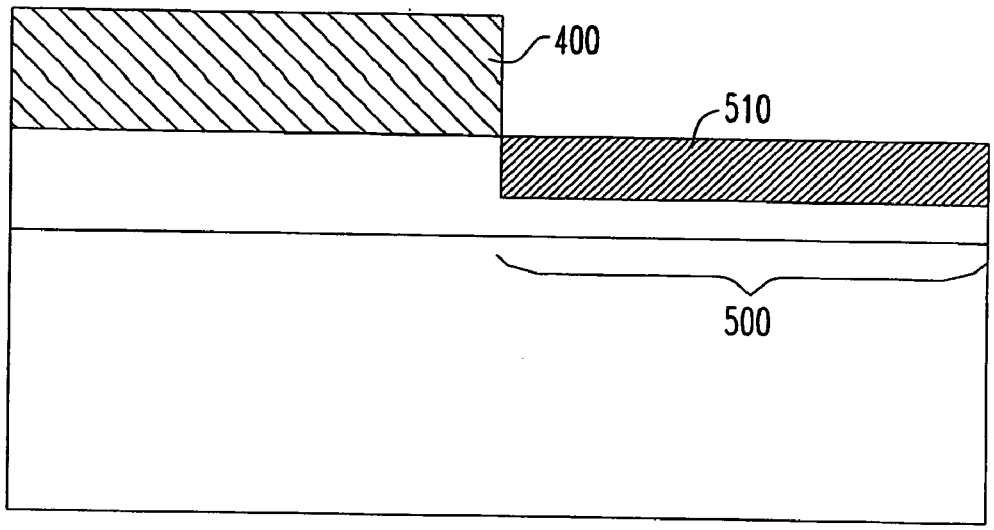
Figure 6:
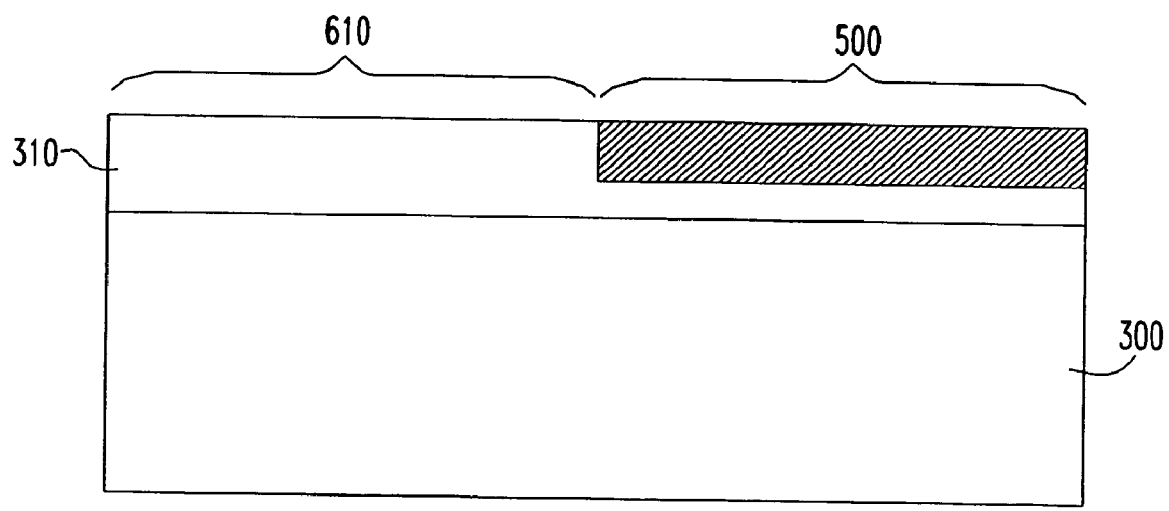

In FIG. 3, the substrate 300 is provided with a stressed film 310 in contact therewith. The film can have either tensile or compressive stress and be made of a variety of materials such as silicon nitride or polysilicon. In FIG. 4, a mask 400 is selectively applied over the film 310. FIG. 5 illustrates the oxidation of the exposed film 310, preferably by HDPO. In FIG. 5, the exposed portion of the film is shown at 500. The HDPO process transforms the exposed portion of the film from stressed to relaxed as shown at 510 through oxidation. Subsequently, the mask 400 is removed, as illustrated in FIG. 6. After the mask removal, the areas of the film 610 which were covered by the mask have retained their stress. The process is effective for modifying the stress of compressive and tensile films and in establishing the structure depicted in FIG. 6.

FIGS. 7 through 14 illustrate other embodiments of the invention. FIGS. 7 through 14 illustrate embodiments for forming a p-type field effect transistor (PFET) and an n-type field effect transistor (NFET) of CMOS circuitry.

Figure 7:
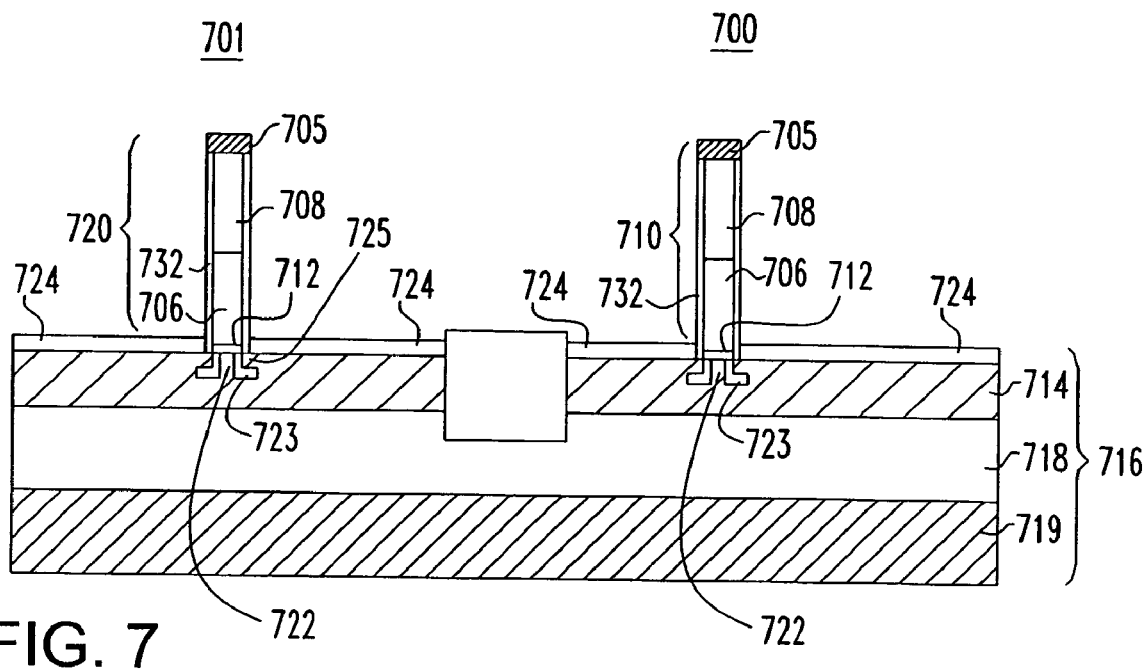
FIGS. 7 through 14 illustrate stages in processing according to a third aspect of the invention for providing a PFET and an NFET having different levels of stress applied to the channel regions thereof, respectively.

As illustrated in FIG. 7, an NFET 700 and a PFET 701 are formed overlying a single-crystal semiconductor region 714 of a substrate 716. As before, the substrate 716 may be formed of a variety of materials as discussed above.

Preferably, the substrate 716 is a semiconductor-on-insulator substrate such as a silicon-on-insulator (SOI) substrate in which a relatively thin single-crystal region 714 of a semiconductor is disposed over an insulating layer 718, which in turn is disposed above a bulk layer of the substrate 719. When field effect transistors (FETs) are formed in such SOI substrates, faster switching operation is often achieved than otherwise, because junction capacitance between the channel region of the transistor and the bulk layer of the substrate 719 is eliminated.

The PFET includes a gate stack 720 having a gate dielectric 712 overlying the single crystal region 714, a gate conductor layer 706 preferably including polysilicon in contact with the gate dielectric and an insulating cap 705, preferably consisting essentially of silicon nitride.

In the PFET 701, the polysilicon lower layer of the gate conductor 706 is preferably heavily doped and includes a p-type dopant such as boron for the purpose of matching the workfunction of the p-type conduction channel that exists when the PFET is turned on in operation. In the NFET 700, the polysilicon lower layer 706 of the gate conductor is also preferably heavily doped and includes an n-type dopant for the purpose of matching the workfunction of the n-type conduction channel that exists when the NFET is turned on in operation. The gate conductor preferably also includes a low-resistance portion 708 disposed above the polysilicon portion. The low-resistance portion 708 has much less resistance than the polysilicon portion, and preferably includes a metal, a silicide of a metal, or both. In a preferred embodiment, the low-resistance portion includes a silicide formed by a self-aligned process (a "salicide"), being a silicide of any suitable metal including but not limited to tungsten, titanium and cobalt. When the gate conductors include a low-resistance portion 708, the insulating cap 705 may be omitted.

Alternatively, the gate conductor can have a different material such as a metal or compound of a metal in contact with the gate dielectric. The gate dielectric is preferably a layer of silicon dioxide thermally grown on the single-crystal semiconductor region 714. The NFET 700 includes a gate stack 710 including a gate dielectric 702 overlying the single crystal region 714, a gate conductor layer 706 preferably including polysilicon in contact with the gate dielectric 702 and an insulating cap 705, preferably consisting essentially of silicon nitride.

As further shown in FIG. 7, the PFET 701 and NFET 700 each include a channel region 722 disposed below the gate stack 720 and 710, respectively. Halo regions 723 and extension regions 725 are preferably disposed adjacent to the channel region 722. The source and drain regions 724 are also provided in the vicinity of the channel region 722. In each of the NFET 700 and PFET 701, the source and drain regions 724 are formed in the single-crystal silicon region 714 and are spaced from the channel regions 722 by pairs of spacers 732.

Figure 8:
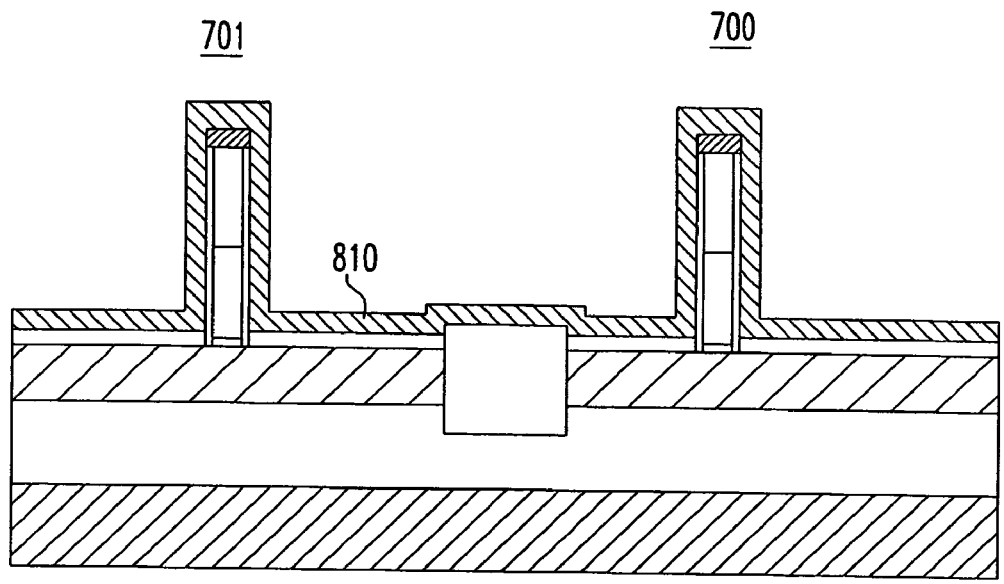
Figure 9:
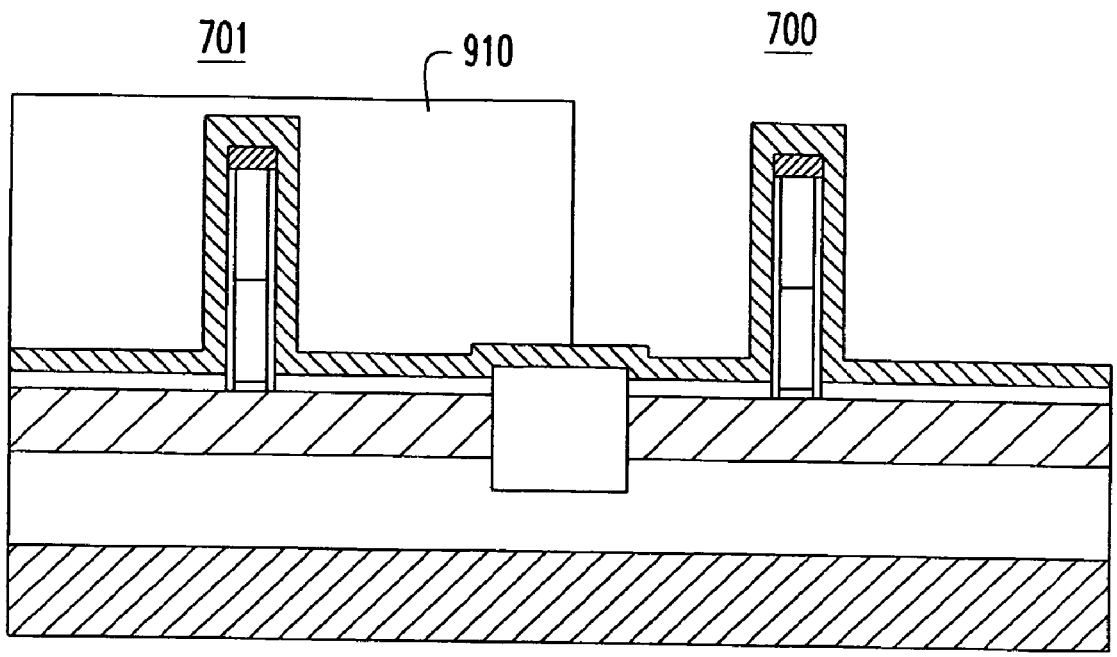

In FIG. 8, a film 810 having an internal stress is formed over the PFET and NFET transistor structures. The stress may be either compressive or tensile. As shown in FIG. 9, a photoresist is deposited and patterned form a mask 910 covering the PFET regions. In this embodiment, a compressive stress is to be applied to the PFET by the film 810 since compressive stress increases the mobility of the holes in the PFET. In the NFET, the compressive stress adversely affects mobility. Thus, the steps which follow relax the compressive stress that is present in the NFET.

Figure 10:
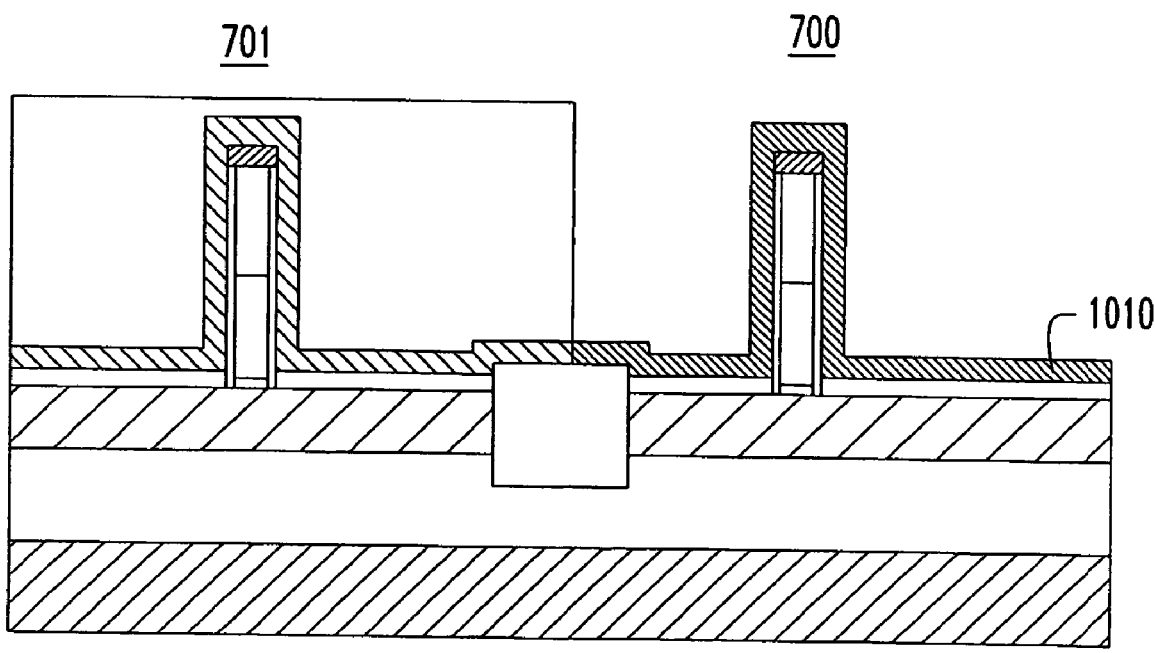

Once the mask 910 is in place, an oxidation process and preferably the HDPO process is performed as illustrated in FIG. 10 at 1010 to grow an oxide layer on the film 810 from a material present in the film. Such oxidation process relaxes the compressive stress present in selected areas of the film exposed in the non-masked areas.

Figure 11:
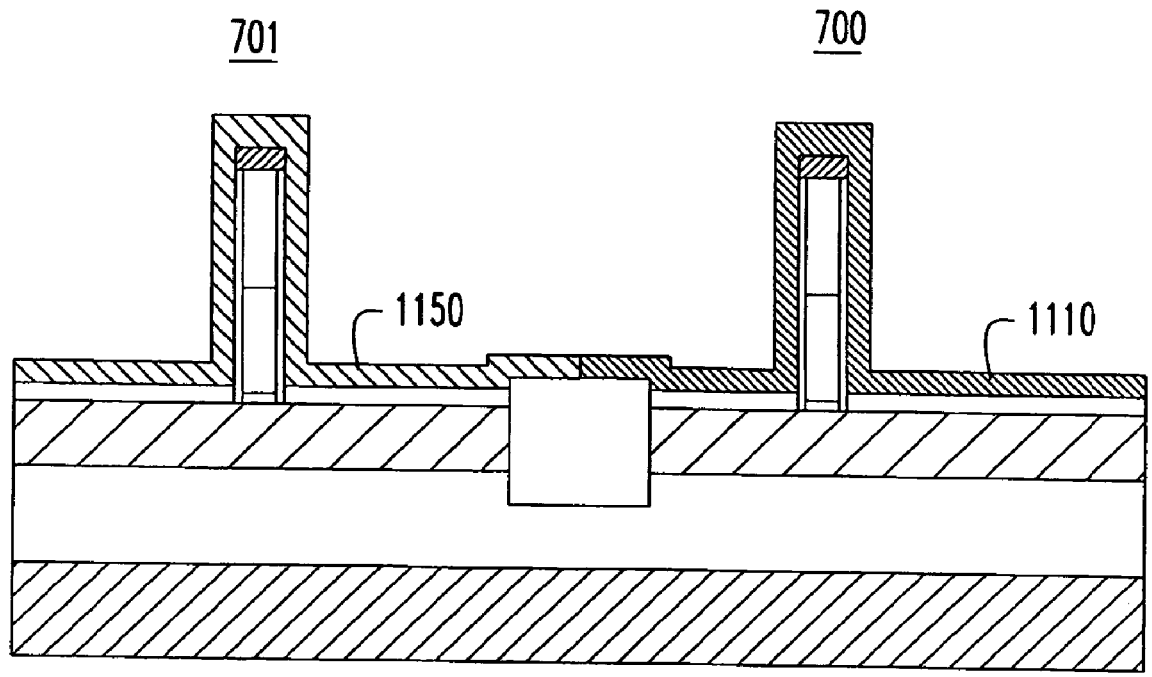

In FIG. 11, the mask 910 is removed from the previously blocked potions. The result is the presence of a relaxed film in selected areas 1110 while the film in the previously unexposed areas 1150 still retains the original stress level. The stress present in the film 1150 applied to the PFET area increases the PFET charge carrier mobility while the relaxed film 1110 in the NFET does not degrade performance, such that a CMOS circuit having both NFET and PFET achieves better performance.

Figure 12:
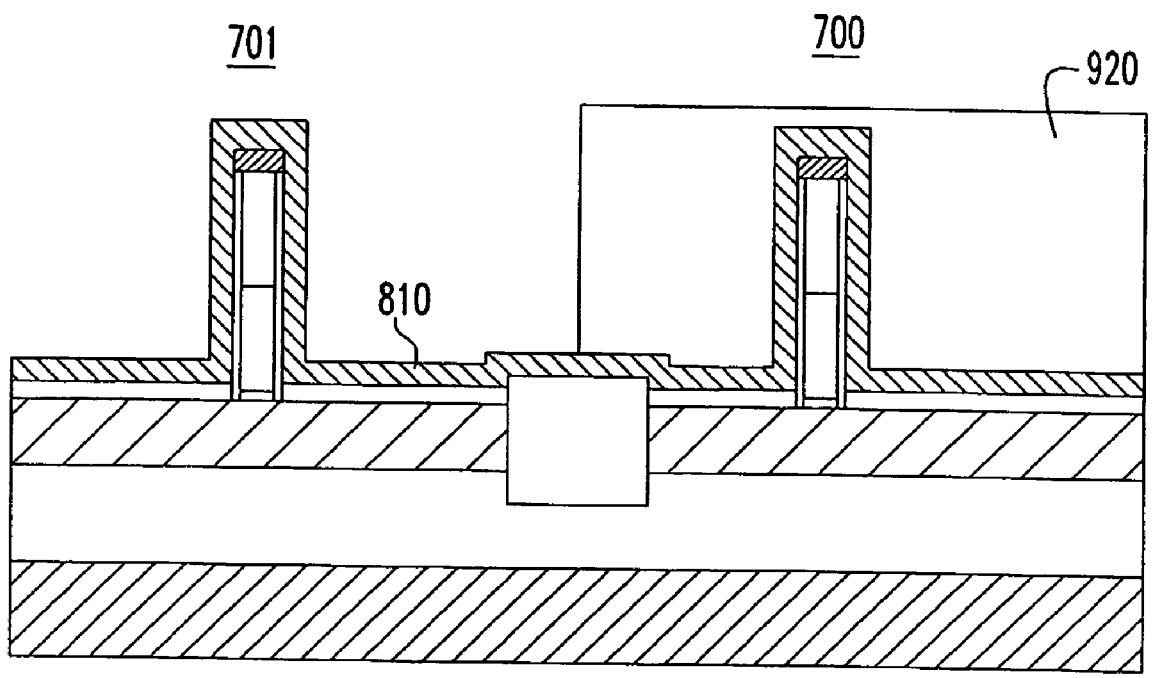
Figure 13:
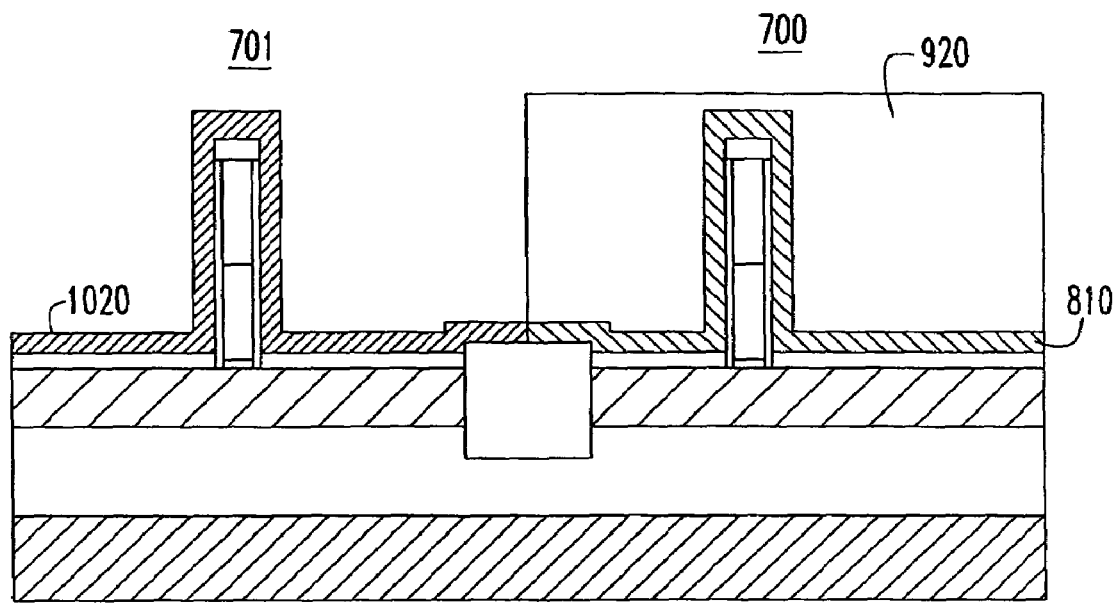
Figure 14:
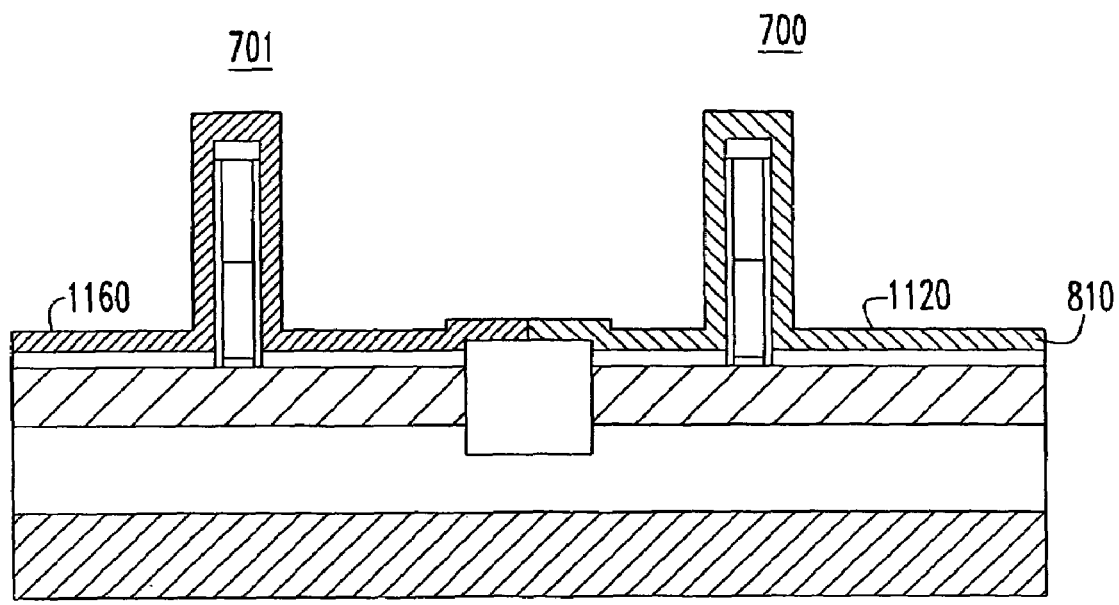

In an alternative embodiment shown in FIGS. 12–14, the film 810 can be provided as a tensile stressed film for increasing the mobility of charge carriers in the NFET. As shown in FIG. 12, a photoresist is deposited and patterned form a mask 920 covering the NFET regions. In the PFET, tensile stress adversely affects mobility. Thus, the steps which follow relax the tensile stress present in the PFET.

Once the mask 920 is in place, an oxidation process, preferably an HDPO process is performed as illustrated in FIG. 13 at 1020 to grow an oxide layer on the film 810 from a material present in the film. Such oxidation process relaxes the tensile stress present in selected areas of the film exposed in the non-masked areas.

In FIG. 14, the mask 920 is removed from the previously blocked potions. The result is the presence of a relaxed film in selected areas 1120 while the film in the previously unexposed areas 1160 still retains the original stress level. The tensile stress present in the film 1120 applied to the NFET area increases the NFET charge carrier mobility while the relaxed film 1160 in the PFET is tolerable, such that a CMOS circuit having both NFET and PFET achieves better performance.

Accordingly, the present invention as provided by its various embodiments describe a single process for creating a layer of film that may be selectively relaxed or stressed in certain areas. The HDPO is used in conjunction with application of block masks in certain embodiments to achieve greater control and ease of processing in achieving such selectivity. In one embodiment of the invention, the above mentioned process can be used to apply a desired compressive stress in the channel region of a PFET without applying the same stress in the channel region of the NFET, and to create a desired tensile stress in the channel region of an NFET without creating the same strain in the channel region of a PFET. Since the strain in each case is provided through the use of a film that is selectively stressed or relaxed, the process provided in the present invention also capitalizes in on the many advantages provided by the use of such films.

While the invention has been described with reference to certain preferred embodiments thereof, those skilled in the art will understand the many modifications and enhancements which can be made without departing from the true scope and spirit of the invention, which is limited only by the appended claims.

What is claimed is:

1. An integrated circuit including a p-type field effect transistor (PFET) and an n-type field effect transistor (NFET), said NFET and said PFET each having a Channel region, a source region and a drain region, comprising:
    a PFET gate stack and an NFET gate stack overtying a substrate including a single-crystal semiconductor region, said PFET gate stack and said NFET gate stack each having a gate conductor overlying a gate dielectric formed on a main surface of said single-crystal region;
    a continuous first film including a first material overlying said source and drain regions of said NFET and said PFET, said first film having a first magnitude stress in a first region where said first film overlies said source and drain regions of one of said NFET or said PFET and said first film having a second magnitude stress lower than said first magnitude stress in a second region where said first film overlies said source and drain regions of the other of said NFET or said PFET, both of said first and second magnitude stresses being non-zero; and
    a layer including an oxide of said first material contacting said first film in said second region, said layer not contacting said first film in said second region, wherein a portion of said first material of said first film in said second region is consumed in said layer including said oxide.

2. The integrated circuit of claim 1 wherein said first and second magnitude stresses are tensile and said second region of said first film overlies said source and drain regions of said PFET, such that said first film has said lower, second magnitude tensile stress in said second region overlying said source and drain regions of said PFET.

3. The integrated circuit of claim 1 wherein said first and second magnitude stresses are compressive and said second region of said first film overlies said source and drain regions of said NFET, such that said first film has said lower, second magnitude compressive stress in said second region overlying said source and drain regions of said NFET.

4. The integrated circuit of claim 1 wherein said substrate consists essentially of silicon.

5. The integrated circuit of claim 1 wherein said substrate includes one or more materials selected from the group consisting of silicon, silicon germanium, silicon dioxide, silicon carbide, and silicon nitride.

6. The integrated circuit of claim 1 wherein said substrate is a semiconductor-on-insulator substrate.

7. The integrated circuit of claim 1 wherein said semiconductor-on-insulator substrate is a silicon-on-insulator (SOI) substrate.

8. The integrated circuit of claim 1 wherein said first film includes silicon nitride.

9. The integrated circuit of claim 1 further comprising dielectric spacers disposed on sidewalls of said gate conductors of said PFET and said NFET, wherein said first film includes polysilicon.

* * * * *